(12) United States Patent
Wang et al.

(10) Patent No.: US 11,682,729 B2
(45) Date of Patent: Jun. 20, 2023

(54) METHODS OF FORMING AIR SPACERS IN SEMICONDUCTOR DEVICES

(71) Applicant: Taiwan Semiconductor Manufacturing Co., Ltd., Hsin-Chu (TW)

(72) Inventors: Chao-Hsun Wang, Taoyuan County (TW); Chen-Ming Lee, Taoyuan County (TW); Kuo-Yi Chao, Hsinchu (TW); Mei-Yun Wang, Hsin-Chu (TW); Pei-Yu Chou, Hsinchu County (TW); Kuo-Ju Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/576,725

(22) Filed: Jan. 14, 2022

(65) Prior Publication Data
US 2022/0140142 A1    May 5, 2022

Related U.S. Application Data

(62) Division of application No. 16/572,320, filed on Sep. 16, 2019, now Pat. No. 11,227,950.

(51) Int. Cl.
*H01L 29/78* (2006.01)
*H01L 21/02* (2006.01)
(Continued)

(52) U.S. Cl.
CPC .... *H01L 29/7848* (2013.01); *H01L 21/02532* (2013.01); *H01L 21/764* (2013.01);
(Continued)

(58) Field of Classification Search
CPC ..... H01L 2221/1042–1047; H01L 2029/7858; H01L 2029/7848; H01L 51/105; H01L 23/5329–53295; H01L 23/53223; H01L 23/53238; H01L 23/53252; H01L 23/53266; H01L 21/76801–76837; H01L 21/76264; H01L 21/823418; H01L 21/76224; H01L 21/823814; H01L 21/76802–76817; H01L 21/76877; H01L 21/76883; H01L 21/76841–76876; H01L 21/76831; H01L 21/02362; H01L 29/7848; H01L 29/41725–41791; H01L 29/7839;
(Continued)

(56) References Cited

U.S. PATENT DOCUMENTS 8,772,109 B2    7/2014  Colinge
8,785,285 B2    7/2014  Tsai et al.
(Continued)

*Primary Examiner* — Victor A Mandala
*Assistant Examiner* — Lawrence C Tynes, Jr.
(74) *Attorney, Agent, or Firm* — Haynes and Boone, LLP

(57) ABSTRACT

A semiconductor structure includes a source/drain (S/D) feature disposed in a semiconductor layer, a metal gate stack (MG) disposed in a first interlayer dielectric (ILD) layer and adjacent to the S/D feature, a second ILD layer disposed over the MG, and an S/D contact disposed over the S/D feature. The semiconductor structure further includes an air gap disposed between a sidewall of a bottom portion of the S/D contact and the first ILD layer, where a sidewall of a top portion of the S/D contact is in direct contact with the second ILD layer.

20 Claims, 9 Drawing Sheets

(51) Int. Cl.
*H01L 27/088* (2006.01)
*H01L 29/417* (2006.01)
*H01L 21/762* (2006.01)
*H01L 21/764* (2006.01)

(52) U.S. Cl.
CPC .... *H01L 21/76224* (2013.01); *H01L 27/0886* (2013.01); *H01L 29/41791* (2013.01)

(58) Field of Classification Search
CPC ..... H01L 29/806; H01L 29/0649–0653; H01L 29/41783; H01L 29/1087; H01L 29/78615
See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,608,077 B1* | 3/2017 | Kye | H01L 27/10894 |
| 10,818,600 B2* | 10/2020 | Lu | H01L 21/7682 |
| 2007/0042580 A1* | 2/2007 | Al-Bayati | H01L 21/02203 438/530 |
| 2012/0037962 A1* | 2/2012 | Breyta | H01L 23/4821 257/288 |
| 2012/0175707 A1* | 7/2012 | Jung | H01L 21/76814 257/E27.06 |
| 2015/0228777 A1* | 8/2015 | Zhang | H01L 29/66772 257/347 |
| 2016/0211363 A1* | 7/2016 | Park | H01L 27/11556 |
| 2016/0372415 A1* | 12/2016 | Siew | H01L 21/7682 |
| 2018/0130796 A1* | 5/2018 | Jun | H01L 21/823821 |
| 2019/0164975 A1* | 5/2019 | Song | H01L 23/5329 |
| 2019/0221475 A1* | 7/2019 | Hong | H01L 21/76831 |
| 2020/0411415 A1* | 12/2020 | Wu | H01L 23/4821 |
| 2021/0050412 A1* | 2/2021 | Wong | H01L 29/6653 |

* cited by examiner

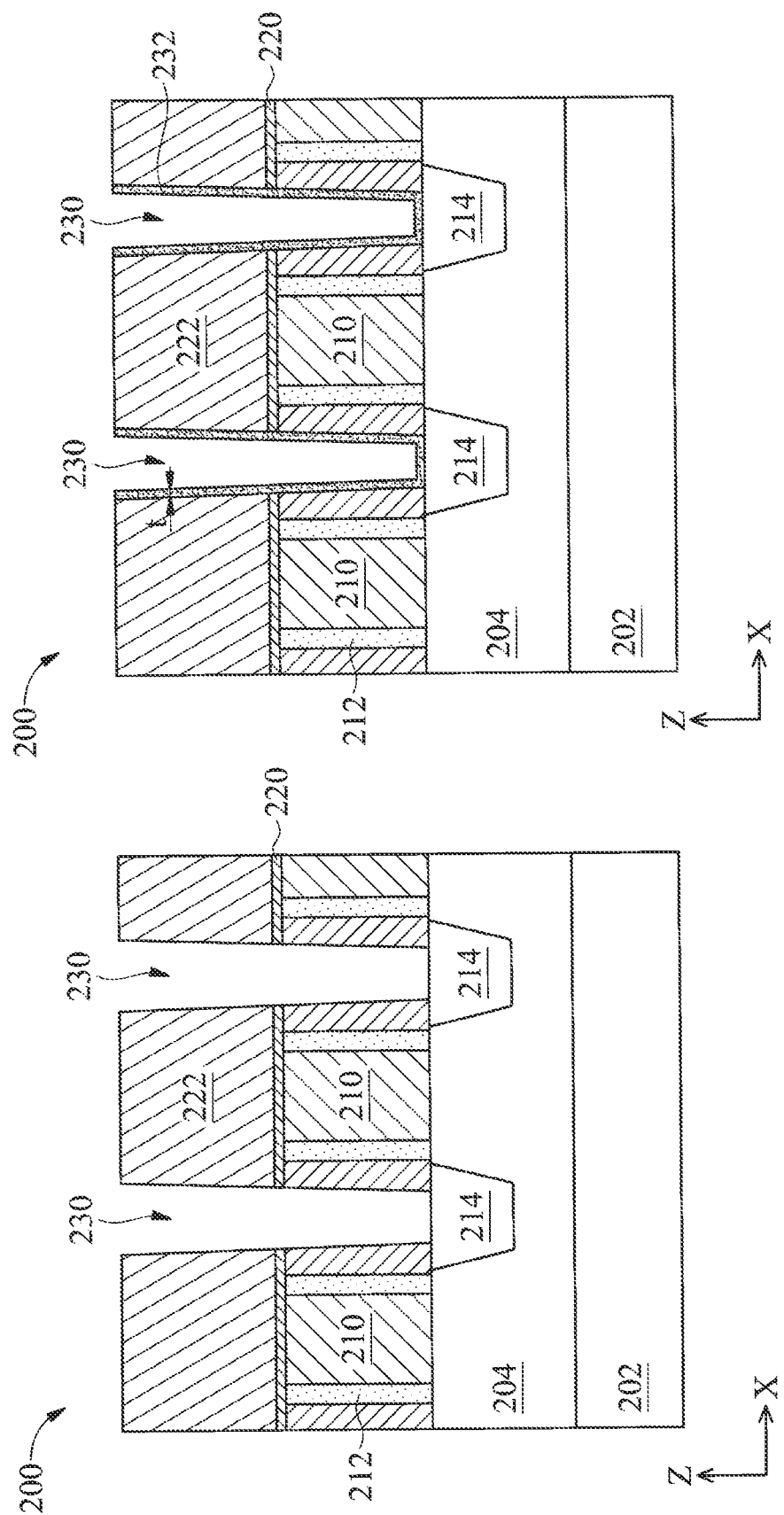

US 11,682,729 B2

METHODS OF FORMING AIR SPACERS IN SEMICONDUCTOR DEVICES

CROSS-REFERENCE TO RELATED APPLICATIONS

This is a divisional of U.S. Non-Provisional Patent Application Serial No. 16/572,320, filed on Sep. 16, 2019 and titled "Methods of Forming Air Spacers in Semiconductor Devices," the entire disclosure of which is incorporated herein by reference.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

For instance, many methods have been developed to reduce parasitic capacitance in FETs. One example includes forming an air gap between neighboring conductive features. While these methods have generally been adequate, they have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8A, 8B, 9A, and 9B are cross-sectional views of the semiconductor device shown in FIGS. 2A and 2B taken along line AA' during intermediate stages of the method shown in FIG. 1 according to various embodiments of the present disclosure.

DETAILED DESCRIPTION

Figure 1:
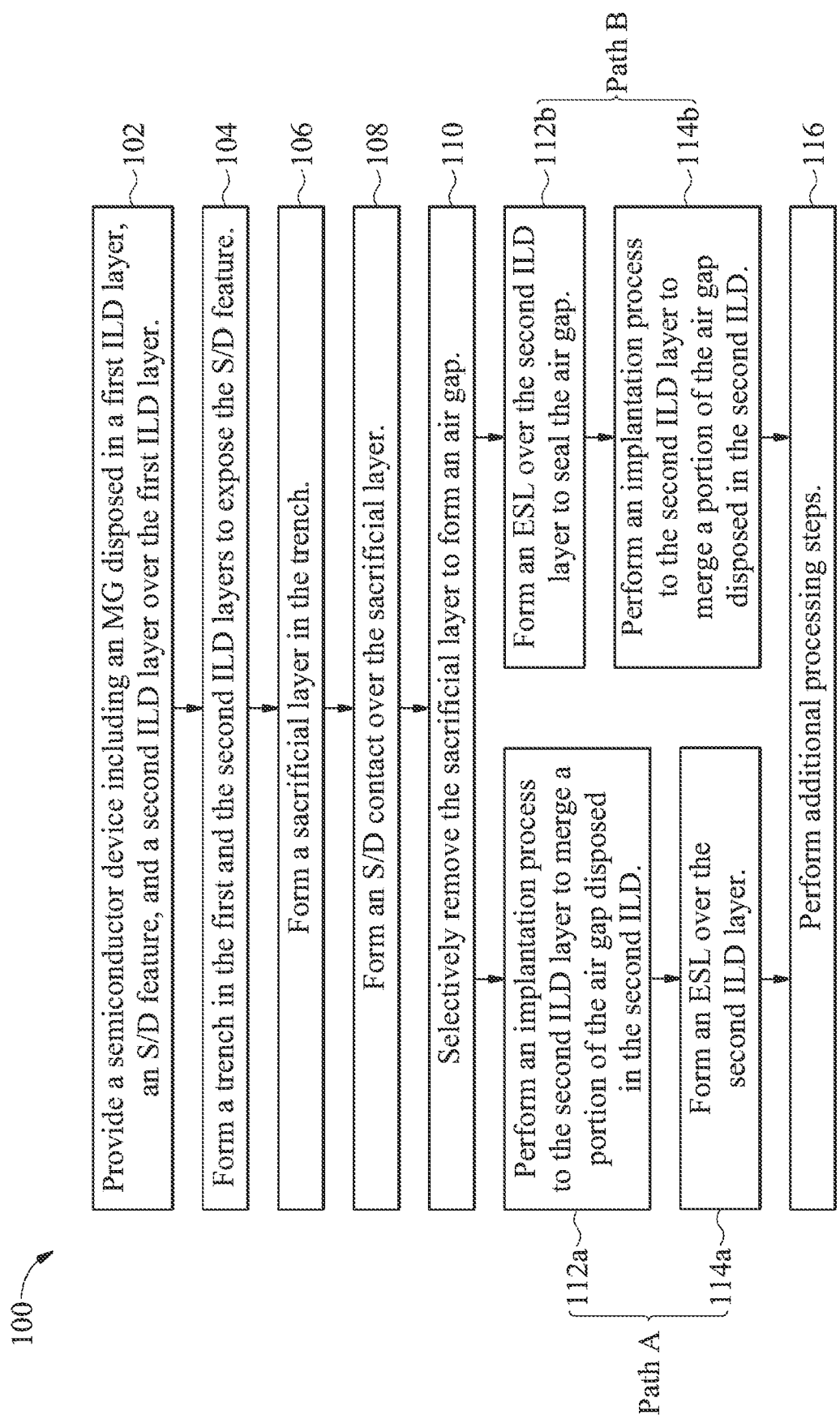
FIG. 1 illustrates a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and fabrication methods thereof, and more particularly to the formation of air gap between source/drain (S/D) contacts and neighboring metal gate structures. During IC fabrication, a general method of lowering parasitic capacitance of a device includes inserting insulating (or dielectric) materials with relatively low dielectric constants (k), such as low-k dielectrics and/or air (by forming an air gap, for example), between device features. In the present disclosure, a "low-k" dielectric material refers to a dielectric material having a dielectric constant less than that of silicon oxide, which is about 3.9. In contrast, therefore, a "high-k" dielectric layer refers to a dielectric material having a dielectric constant greater than that of silicon oxide. While air gap has been generally adequate in lowering parasitic capacitance, it may become a source of structural defect during subsequent processing steps. In one example, when forming a via contact over the S/D contact, inadvertent over-etching may open already-sealed air gap and cause damage to the surrounding dielectric components. Furthermore, when performing a wet etching process, chemical etchant may penetrate the opened air gap and cause damage to the underlying S/D features and/or metal gate structures. For these and other reasons, improvements in methods of forming air gaps are desired.

Referring now to FIG. 1, a flowchart of a method 100 of forming a semiconductor device 200 (hereafter simply referred to as the device 200) is illustrated according to various aspects of the present disclosure. Method 100 is merely an example and is not intended to limit the present disclosure beyond what is explicitly recited in the claims. Additional operations can be provided before, during, and after method 100, and some operations described can be replaced, eliminated, or moved around for additional embodiments of the method. Method 100 is described below in conjunction with FIGS. 2A-9B, which illustrate a portion of the device 200 during intermediate stages of method 100. FIGS. 3-9B are cross-sectional views of the device 200 taken along the dashed line AA' shown in FIGS. 2A and 2B at intermediate steps of method 100. The device 200 may be an intermediate device fabricated during processing of an IC, or a portion thereof, that may include static random-access memory (SRAM) and/or other logic circuits, passive components such as resistors, capacitors, and inductors, and active components such as p-type FETs (PFETs), n-type FETs (NFETs), FinFETs, gate-all-around (GAA) FETs, metal-oxide semiconductor field effect transistors (MOSFETs), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the device 200 as illustrated is a three-dimensional FinFET device, the present disclosure may also provide embodiments for fabricating planar FET devices. Additional features can be added in semiconductor device 200, and some of the features described below can be replaced, modified, or eliminated in other embodiments of semiconductor device 200.

Figure 2A:
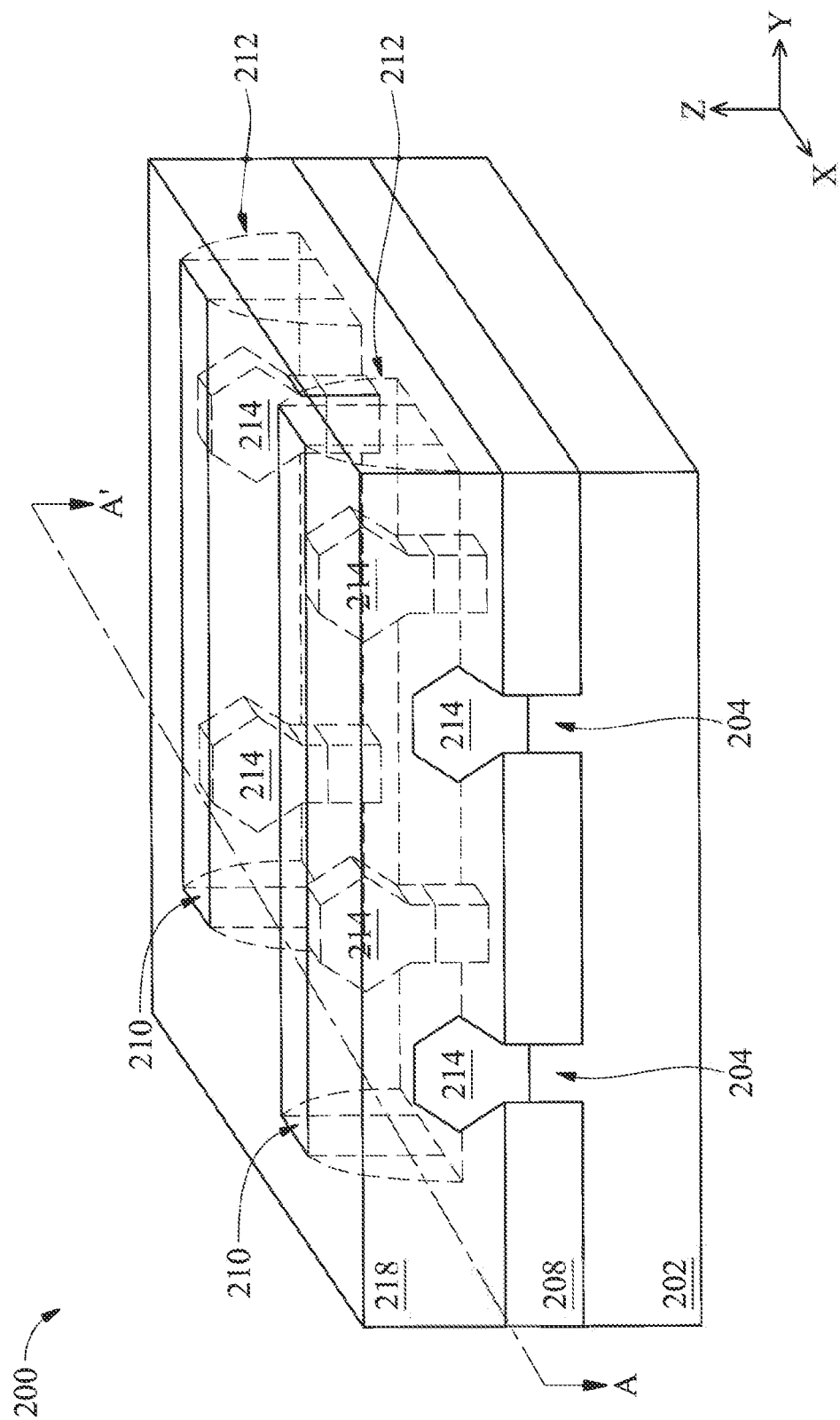
FIG. 2A is a three-dimensional perspective view of an example semiconductor device according to various embodiments of the present disclosure.
Figure 2B:
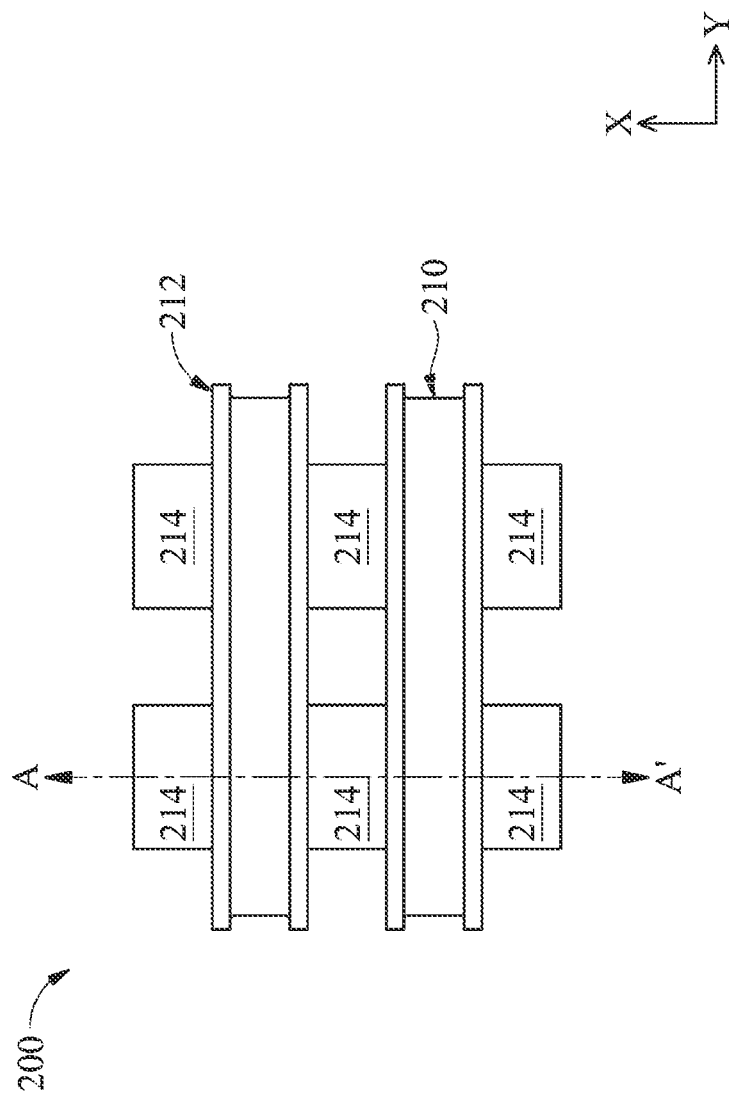
FIG. 2B is a planar top view of the semiconductor device shown in FIG. 2A according to various embodiments of the present disclosure.
Figure 3:
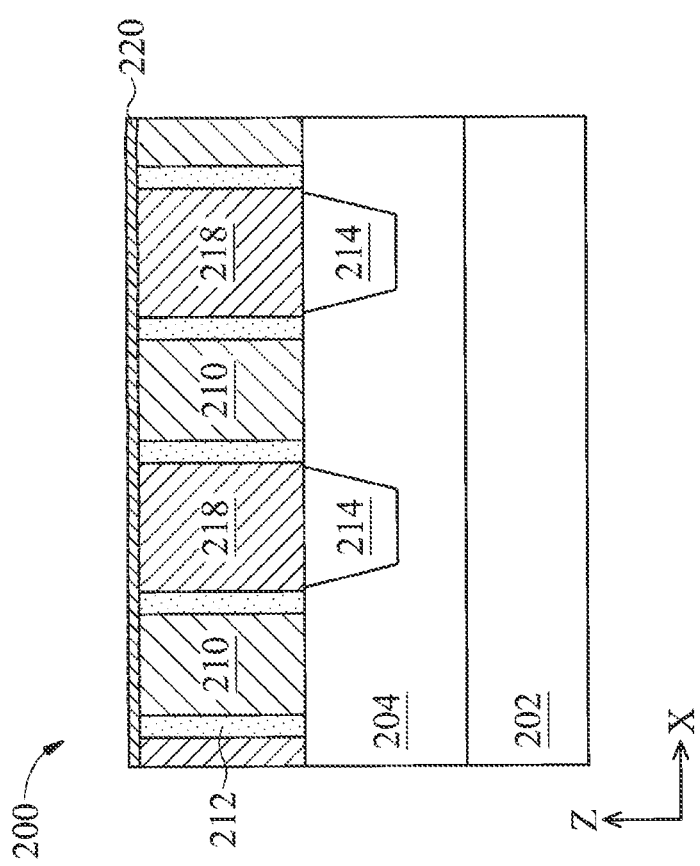

At operation 102, referring to FIGS. 2A, 2B, and 3, method 100 provides, or is provided with, the device 200 that includes a substrate 202 having at least one semiconductor layer 204 (e.g., an active region such as a three-dimensional fin; hereafter referred to as a fin 204) disposed thereon, a high-k metal gate (HKMG) structure 210 disposed over the fin 204, isolation structures 208 disposed over the substrate 202 separating various components of the device 200, S/D features 214 disposed over the fin 204 and interposing HKMG structures 210, and an interlayer dielectric (ILD) layer 218 disposed over the S/D features 214. "High-k," as used herein, refers to a dielectric material having a dielectric constant greater than that of silicon oxide, which is approximately 3.9. As depicted herein, the device 200 may include multiple fins 204 oriented lengthwise along the X direction and multiple HKMG structures 210 oriented lengthwise along the Y direction, i.e., generally perpendicular to the fin 204. Referring to FIG. 3, the device 200 includes additional features such as gate spacers 212 disposed on sidewalls of the HKMG structure 210, an etch-stop layer (ESL) 220 disposed over the HKMG structure 210, and numerous other features. For purpose of simplicity, intermediate steps of method 100 are hereafter described with reference to cross-sectional views (FIGS. 3-9B) of the device 200 taken along a length of the fin 204 (i.e., the line AA' in the X direction).

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

The fin 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fin 204 may be suitable. For example, the fin 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, a low-k dielectric material, and/or other suitable materials. The isolation structures 208 may include shallow trench isolation (STI) features. In one embodiment, the isolation structures 208 are formed by etching trenches in the substrate 202 during the formation of the fin 204. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof.

Still referring to FIGS. 2A, 2B, and 3, the device 200 includes S/D features 214 disposed in or over the fin 204 and adjacent to the HKMG structure 210. The S/D features 214 may be formed by any suitable techniques, such as etching processes followed by one or more epitaxial processes. In one example, one or more etching processes are performed to remove portions of the fin 204 to form recesses (not shown) therein. A cleaning process may be performed to clean the recesses with a hydrofluoric acid (HF) solution and/or other suitable solutions. Subsequently, one or more epitaxial growth processes are performed to grow epitaxial features in the recesses. Each of the S/D features 214 may be suitable for forming a p-type FinFET device (e.g., including a p-type epitaxial material) or alternatively, an n-type FinFET device (e.g., including an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

The device 200 further includes the HKMG structure 210 disposed over a portion of the fin 204. The HKMG structure 210 includes a high-k dielectric layer (not depicted) disposed over the fin 204 and a metal gate electrode (not depicted) disposed over the high-k dielectric layer. The metal gate electrode may further include at least one work function metal layer and a bulk conductive layer disposed thereover. The work function metal layer may be a p-type or an n-type work function metal layer. Example work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The bulk conductive layer may include Cu, W, Al, Co, Ru, other suitable materials, or combinations thereof. The HKMG structure 210 may further include other layers (not depicted), such as an interfacial layer disposed between the fin 204 and the high-k dielectric layer, capping layers, barrier layers, other suitable layers, or combinations thereof. Various layers of the HKMG structure 210 may be deposited by any suitable method, such as chemical oxidation, thermal oxidation, atomic layer deposition (ALD), CVD, physical vapor deposition (PVD), plating, other suitable methods, or combinations thereof.

The device 200 may further include gate spacers 212 disposed on sidewalls of the HKMG structure 210. In some embodiments, the gate spacers 212 include one or more of the following elements: silicon, oxygen, nitrogen, and carbon. For example, the gate spacers 212 may include a dielectric material such as silicon oxide, silicon nitride, silicon carbide, silicon oxynitride, silicon oxycarbide, other suitable dielectric materials, or combinations thereof. Notably, the present disclosure provides that compositions of the gate spacers 212, the ILD layer 218, and the ESL 220 are different, such that they may be etched at different rates during an etching process. The gate spacers 212 may be formed by first depositing a blanket of spacer material over the device 200, and then performing an anisotropic etching process to remove portions of the spacer material to form the gate spacers 212 on sidewalls of the HKMG structure 210.

In some embodiments, still referring to FIG. 3, the HKMG structure 210 are formed after other components of the device 200 (e.g., the S/D features 214) are fabricated. Such process is generally referred to as a gate replacement process, which includes forming a dummy gate structure (not depicted) as a placeholder for the HKMG structure 210, forming the S/D features 214, forming the ILD layer 218 over the S/D features 214, planarizing the ILD layer 218 to expose a top surface of the dummy gate structure, removing the dummy gate structure to form a trench that exposes channel regions of the fin 204, and forming the HKMG structure 210 in the trench to complete the gate replacement process. Thereafter, a polishing process, such as a CMP process, may be performed to remove excess materials from a top surface of the HKMG structure 210 to planarize a top surface of the device 200. In some embodiments, the ILD layer 218 includes a dielectric material, such as silicon oxide, a low-k dielectric material, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.) other suitable dielectric materials, or combinations thereof. The ILD layer 218 may include a multi-layer structure or a single-layer structure and may be formed by a deposition process such as, for example, CVD, FCVD, SOG, other suitable methods, or combinations thereof. The ESL 220 may include silicon nitride, silicon oxynitride, silicon nitride with oxygen and/or carbon elements, aluminum oxide, aluminum nitride, other suitable materials, or combinations thereof, and may be formed by CVD, PVD, ALD, other suitable methods, or combinations thereof.

Referring to FIG. 4, method 100 at operation 104 forms a trench 230 (i.e., an s/D contact trench) to expose the S/D features 214. In the present embodiments, method 100 first forms an ILD layer 222 over the ESL 220 and subsequently removes portions of the ILD layer 222, the ESL 220, and the ILD layer 218 to form the trench 230. In the present embodiments, the ILD layer 222 includes silicon oxide, a low-k dielectric material, or combinations thereof. In some embodiments, the low-k dielectric material is a silicon-containing low-k dielectric material. In some embodiments, the ILD layer 222 includes a dielectric material having a density equal to or less than that of silicon oxide, which is about 2.1 $g/cm^3$ to about 2.6 $g/cm^3$. In some embodiments, the ILD layer 222 is free of a nitrogen-containing dielectric material such as silicon nitride, which has a density of about 2.8 $g/cm^3$ to about 3.2 $g/cm^3$. As will be discussed in detail below, the ILD layer 222 includes a low-density (e.g., porous) dielectric material in order to accommodate subsequent processing steps. The ILD layer 222 may be formed in a process similar to that discussed above with respect to the ILD layer 218.

Method 100 may subsequently form the trench 230 in a series of patterning and etching processes. For example, a masking element (not depicted) that includes a photoresist layer as a top layer may be first formed over the ILD layer 222 and subsequently patterned to expose portions of the ILD layer 222 to be removed. The patterning process may include exposing the masking element to a radiation source through a patterned photomask to form a latent image in the masking element, developing the latent image to form a patterned masking element, and optionally baking the patterned masking element. Thereafter, method 100 implements a suitable etching process to anisotropically remove portions of the material layers (e.g., the ILD layer 222, the ILD layer 218, and the ESL 220) disposed over the S/D features 214 using the patterned masking element as an etching mask, resulting in the trench 230. In an example embodiment, method 100 implements a dry etching process using an etchant including a fluorine-containing gas (e.g., $CF_4$, $SF_6$, $CH_2F_2$, $CHF_3$, and/or $C_2F_6$), $H_2$, $O_2$, other suitable gases, or combinations thereof. Thereafter, the patterned masking element is removed from the device 200 by any suitable method such as resist stripping or plasma ashing.

Referring to FIG. 5, method 100 at operation 106 forms a sacrificial layer 232 in the trench 230. In the present embodiments, the sacrificial layer 232 includes a dielectric material having a composition different from its surrounding material layers, such that the sacrificial layer 232 may be selectively etched with respect to the ILD layer 222, the ESL 220, and the ILD layer 218 in a subsequent processing step. In some embodiments, the sacrificial layer 232 includes silicon, oxygen, nitrogen, carbon, other suitable materials, or combinations thereof. In an example embodiment, the sacrificial layer 232 includes silicon in the form of, for example, amorphous silicon. The sacrificial layer 232 may be formed by any suitable method such as ALD, CVD, PVD, or combinations thereof. In some embodiments, as depicted herein, the sacrificial layer 232 is formed on a bottom and sidewall surfaces of the trench 230. In some embodiments, the sacrificial layer 232 is selectively formed on the sidewalls of the trench 230 (e.g., on portions of the ILD layer 222, the ESL 220, and the ILD layer 218) and not on the S/D features 214. In the present embodiments, the sacrificial layer 232 is subsequently removed from the device 200, thereby forming an air gap between an S/D contact formed in the trench 230 and portions of the ILD layer 222, the ESL 220, and the ILD layer 218. As such, a thickness t of the sacrificial layer 232 defines a width of the air gap. In some embodiments, the thickness t is about 1 nm to about 5 nm. It is noted that, on one hand, if the thickness t is less than about 1 nm, the reduction in parasitic capacitance in the device 200 may not be realized; on the other hand, an air gap measuring great than about 5 nm in width (i.e., the thickness t greater than about 5 nm) may impede the performance of subsequent processing steps.

Figures 6, 7:
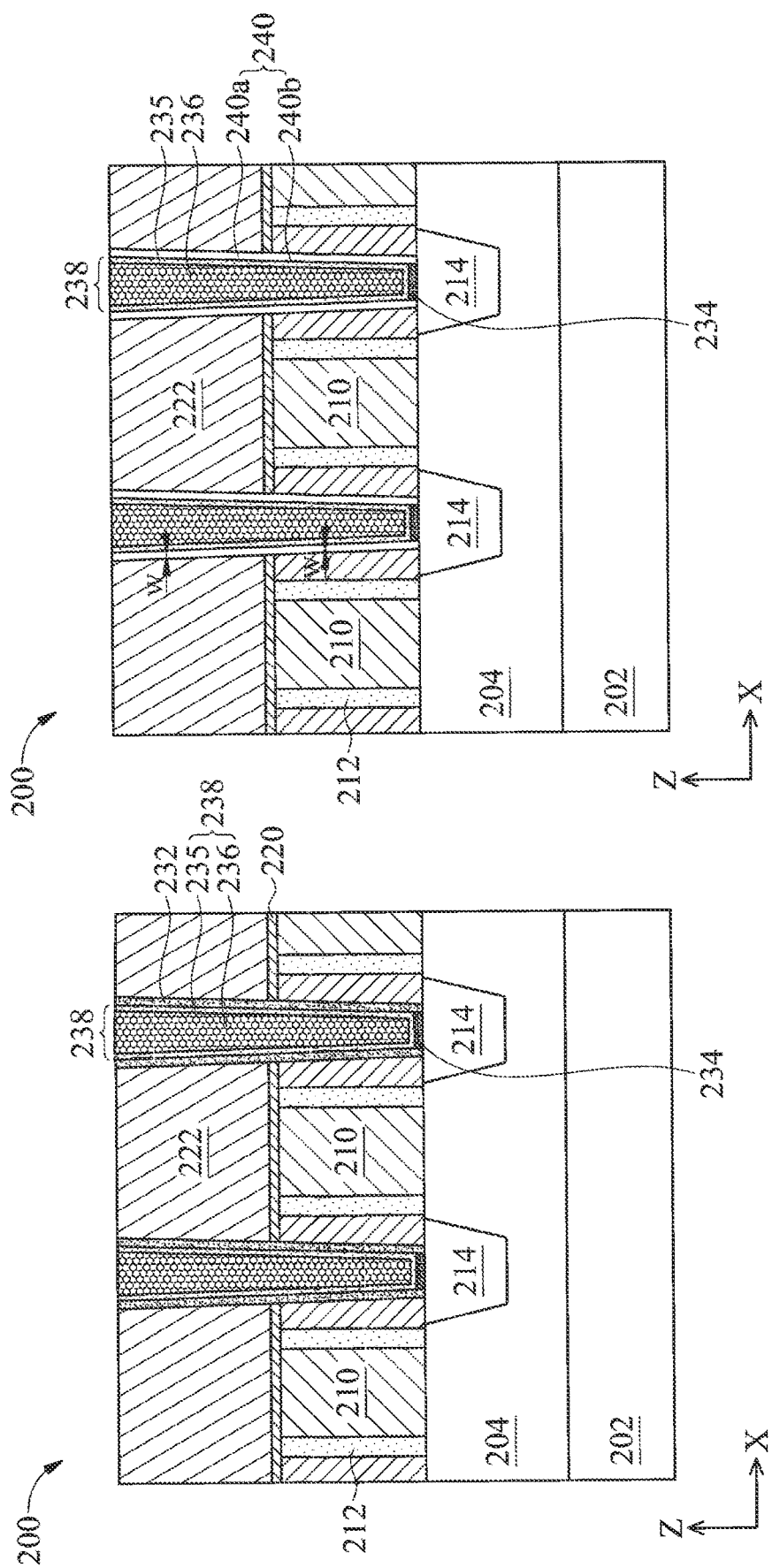

Referring to FIG. 6, method 100 at operation 108 forms the S/D contact 238 over the sacrificial layer 232 in the trench 230. The S/D contact 238 includes a conductive layer 236 disposed over a barrier layer 235. The barrier layer 235 may include titanium nitride, tantalum nitride, tungsten nitride, other suitable materials, or combinations thereof and may be formed over the sacrificial layer 232 using any suitable method such as ALD, CVD, PVD, other suitable methods, or combinations thereof. In some embodiments, the barrier layer 235 is omitted from the device 200. The conductive layer 236 may include Cu, W, Al, Co, Ru, other suitable materials, or combinations thereof. The conductive layer 236 may be formed by any suitable method such as CVD, ALD, PVD, plating, other suitable methods, or combinations thereof.

As illustrated in FIG. 6, before forming the S/D contact 238, method 100 may form a silicide layer 234 over the S/D features 214. If a portion of the sacrificial layer 232 is formed over the S/D features 214 as discussed above, forming the silicide layer 234 may remove that portion of the sacrificial layer 232, such that the silicide layer 234 contacts the S/D features 214 directly. In some embodiments, the silicide layer 234 includes nickel silicide, cobalt silicide, tungsten silicide, tantalum silicide, titanium silicide, platinum silicide, erbium silicide, palladium silicide, other suitable silicide, or combinations thereof. After performing an optional cleaning process to remove any residue and/or any portion of the sacrificial layer 232 remaining over the S/D features 214, the silicide layer 234 may be formed by a deposition process such as CVD, ALD, PVD, other suitable processes, or combinations thereof. As an example, a metal layer (e.g., titanium) may be deposited over the S/D features 214, and the device 200 is annealed to allow the metal layer and the semiconductor materials of the S/D features 214 to react. Thereafter, the un-reacted metal layer is removed, leaving the silicide layer 234 over the S/D features 214. Alternatively, the silicide layer 234 may be deposited directly over the S/D features 214 by a suitable deposition process.

Referring to FIG. 7, method 100 at operation 110 selectively removes the sacrificial layer 232 to form an air gap 240 that includes an upper portion 240a and a lower portion 240b. In the present embodiments, the upper portion 240a is disposed in the ILD layer 222 and the lower portion 240b is disposed below the upper portion 240a. In other words, the upper portion 240a is defined by the S/D contact 238 and the ILD layer 222, and the lower portion 240b is defined by the S/D contact 238 and portions of the ESL 220 and the ILD layer 218. As discussed above, the resulting air gap 240 may be defined by the width w, which is substantially equivalent to the thickness t of the sacrificial layer 232. In some examples, the width w is greater than 0 but less than about 4 nm, a threshold above which the merging of the upper portion 240a may require more than one implantation process and/or greater dosage of the dopant particles. In the present embodiments, the sacrificial layer 232 is selectively etched at operation 110, such that portions of the ILD layer 222, the ESL 220, the ILD layer 218, and the barrier layer 235 in contact with the sacrificial layer 232 are not, or not substantially, etched. In some embodiments, method 100 implements a dry etching process using an etchant including $H_2$ and/or $NF_3$ to selectively remove the sacrificial layer 232.

Referring back to FIG. 1, method 100 may proceed from operation 110 in one of two alternative paths, Path A and Path B. In the following disclosure, Path A will be discussed with reference to FIGS. 8A and 8B, and Path B will be discussed with reference to FIGS. 9A and 9B. It is understood that the present disclosure does not require method 100 to proceed in any specific path, i.e., embodiments depicted in Path A and Path B are equally applicable. As discussed in detail below, Path A is directed to an embodiment in which an implantation process is first performed to the ILD layer 222, followed by the formation of an ESL over the ILD layer 222. Path B, on the other hand, is directed to an embodiment in which an ESL is first formed over the ILD layer 222, followed by the performing of an implantation process to the underlying ILD layer 222. As such, Path A is referred to as an "ESL last" process and Path B is referred to as an "ESL first" process for purposes of the present disclosure.

Figures 8A, 8B:
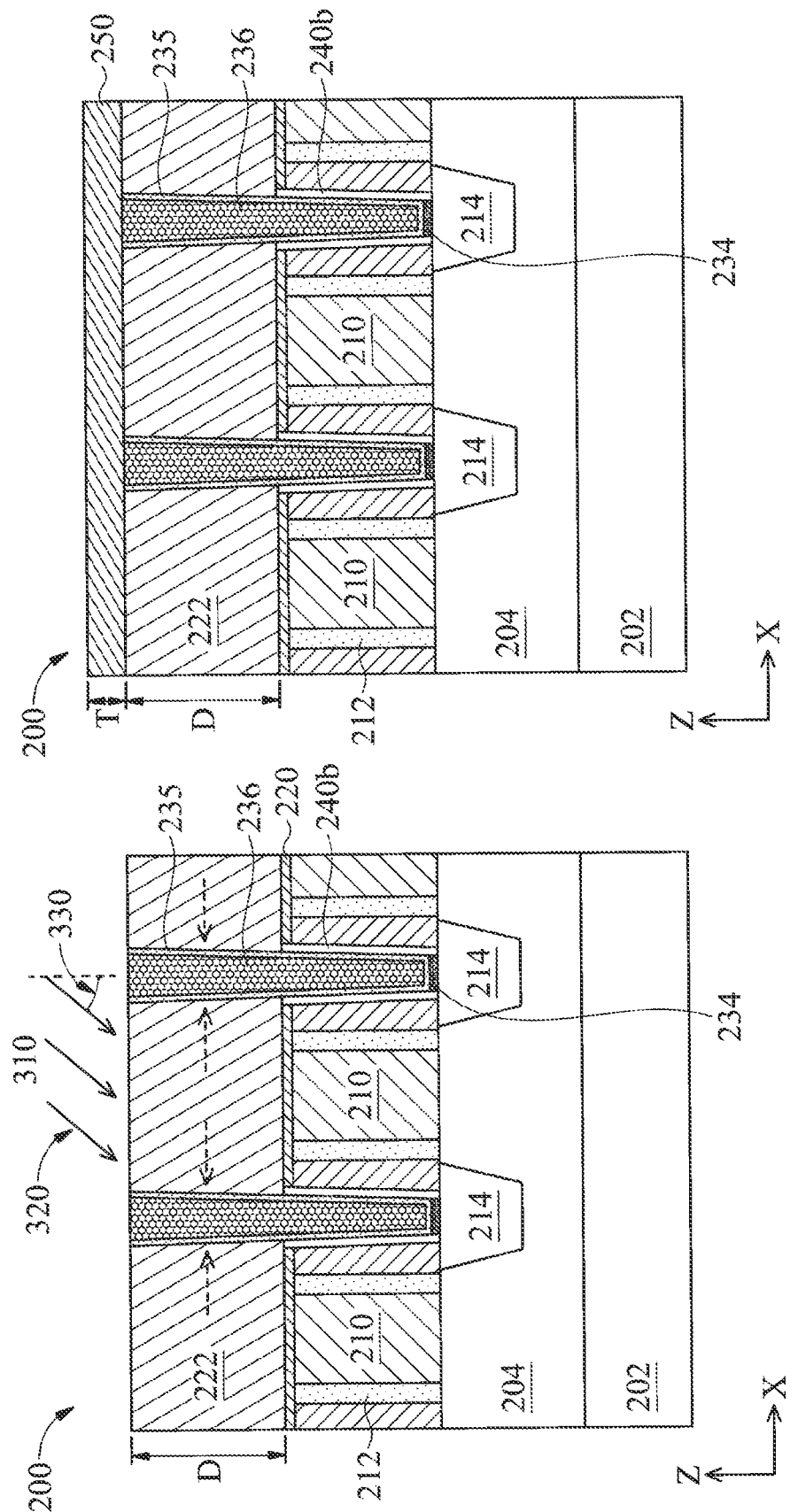

With respect to Path A, referring to FIG. 8A now, method 100 at operation 112a performs an implantation (or ion implantation) process 310 to the device 200. In the present embodiments, by introducing a dopant into the ILD layer 222, the implantation process 310 is configured to fill the upper portion 240a of the air gap 240 without filling the lower portion 240b of the air gap 240. In other words, the implantation process 310 causes portions of the ILD layer 222 to expand (schematically indicated by the dotted arrows), such that the width w of the air gap 240 is reduced to about 0 in the upper portion 240a but remains substantially unchanged in the lower portion 240b. Stated a different way, the implantation process 310 is configured to merge portions of the ILD layer 222 with sidewall portions of the S/D contact 238, thereby filling the upper portion 240a of the air gap 240. Stated yet another way, the implantation process 310 causes the ILD layer 222 to seal a top opening of the air gap 240, such that the remaining portion of the air gap 240 (i.e., the lower portion 240b) extends from the S/D features 214 through the ILD layer 218 and the ESL 220 but not through the ILD layer 222.

The implantation process 310 is generally implemented in an ion implantation apparatus that includes at least an ion source configured to produce a beam 320 comprising ions (hereafter referred to as the dopant particles) of a desired element, a device for selecting ions of the beam that have a specific beam energy, and an accelerator configured to accelerate the beam toward a target (e.g., the device 200 having the ILD layer 222 disposed at its top surface); of course, other components may also be included in the ion implantation apparatus. In the present embodiments, as the beam 320 is accelerated toward and penetrates the device 200, the dopant particles of the beam 320 are introduced into the ILD layer 222. By tuning various processing parameters of the implantation process 310 (discussed in detail below), penetration of the beam 320 may be confined within the ILD layer 222 and not the ESL 220 or other underlying material layers. Due to differences in size between the dopant particles and the major constituent (i.e., silicon) of the ILD layer 222 the dopant particles cause strain in the molecular structure of the ILD layer 222, thereby expanding the ILD layer 222 to occupy any available free space, i.e., the upper portion 240a of the air gap 240. In other words, the dopant particles enlarge the volume of the ILD layer 222, thereby merging the ILD layer 222 with the sidewall portions of the S/D contact 238 and closing the upper portion 240a. In some embodiments, as discussed above, the low-density (e.g., porosity) of the ILD layer 222 also contributes positively to the expansion of the ILD layer 222 as a result of the implantation process 310.

In the present embodiments, the implantation process 310 may be controlled by adjusting one or more of the following parameters: composition of the dopant particles, dosage of the dopant particles, energy of the beam 320, or angle 330 of the beam 320. As discussed above, it is important for the dopant particles to exhibit a different atomic radius (i.e., atomic number) from that of the major constituent of the ILD layer 222. In the present embodiments, the dopant particles exhibit a larger atomic radius (i.e., has a larger atomic number) than silicon, which is present in the ILD layer 222 in the form of silicon oxide and/or a silicon-containing low-k dielectric material as discussed above. In some embodiments, the dopant particles are of the same group or period (e.g., Group IV or Period III) as silicon. In some embodiments, the dopant particles are of a neighboring group (e.g., Group V) or period (e.g., Period IV) to silicon. Furthermore, in the present embodiments, because the ILD layer 222 serves to provide insulation for subsequently-formed device features (e.g., interconnect features), the dopant particles are free of any metallic (i.e., electrically conductive) elements. In some examples, the dopant particles include elements such as germanium and/or arsenic.

In the present embodiments, the dosage of the dopant particles describes the total amount of dopant particles per unit area (unit: atoms/cm$^2$) impinged upon the ILD layer 222. It is a parameter that generally reflects the amount of dopant particles needed to expand the ILD layer 222 and eliminate the upper portion 240a. Thus, as provided herein, the dosage of the dopant particles varies based on a thickness D of the ILD layer 222 and/or the width w of the upper portion 240a as defined in FIG. 7. In one example, an increase in the thickness D would generally increase the dosage of the dopant particles. In another example, an increase in the width w of the upper portion 240a would also generally increase the dosage of the dopant particles. In some examples, if the thickness D exceeds about 25 nm, method 100 may implement operation 112a more than once, i.e., repeat the implantation process 310 at least once, in order to supply sufficient dosage of the dopant particles for merging the upper portion 240a. On the other hand, if the thickness D is less than about 25 nm, method 100 may only perform the implantation process 310 once and form the structure as depicted in FIG. 8A. In the present embodiments, the dosage of the dopant particles is about 1E14 to about 5E16 atoms/cm$^2$. In some embodiments, if the dosage is less than about 1E14 atoms/cm$^2$, not enough dopant particles are supplied by the implantation process 310 and the upper portion 240a may not be completely filled. In some embodiments, if the dosage is greater than about 5E16 atoms/cm$^2$, excess dopant particles may penetrate and inadvertently bombard other device features such as the HKMG structure 210, the fin 204, and/or other device features. In some examples, the resulting concentration of the dopant particles found in the ILD layer 222 is about 1E19 atoms/cm$^3$ to about 1E22 atoms/cm$^3$. Of course, other values of the concentration of the dopant particles may also be applicable in the present disclosure depending upon the specific design requirement and the dosage implemented during the implantation process 310.

In the present embodiments, while other factors being constant, the maximum energy of the beam 320 determines the maximum depth that may be penetrated by the dopant particles. In some embodiments, any additional material layer(s) disposed over the ILD layer 222 would generally increase the energy of the beam 320 need to penetrate the ILD layer 222, though the dosage of the dopant particles may remain substantially unchanged. In some embodiments, holding the dosage constant, changes in the angle of the beam (discussed in detail below) would result in changes in the energy of the beam 320.

The beam 320 may impinge the device 200 at an angle 330 with respect to a normal of the surface of the ILD layer 222. In the present embodiments, the angle 330 is not limited to any particular value so long as it is within the ion implantation apparatus's allowed range of motion. In some examples of the present disclosure, the angle 330 is about 0° (i.e., the beam 320 is normal to the ILD layer 222) to about 60°. Other factors being constant, increasing the angle 330 generally decreases the penetration depth of the dopant particles. Thus, in order to maintain the overall implantation result, an increase in the angle 330 may increase the energy of the beam 320 needed to penetrate the ILD layer 222. On the contrary, a decrease in the angle 330 lowers the energy needed for the beam 320 to penetrate the ILD layer 222. Thus, the angle 330 may be adjusted in accordance with the energy of the beam 320 to achieve desired implantation results. With respect to Path A during which the ESL 250 is formed after performing the implantation process 310, the angle 330 may be adjusted to be greater than about 15° to minimize potential damage to the S/D features 214 by the beam 320.

In the present embodiments, the filling of the upper portion 240a leaves behind a partial air gap (i.e., the lower portion 240b) between a portion of the S/D contact 238 and the HKMG structure 210. In other words, after performing operation 112a, method 100 seals the air gap 240 by expanding the ILD layer 222 to merge with the sidewall portions of the S/D contact 238 (e.g., the barrier layer 235), effectively confining the air gap 240 between the ILD layer 222 and the S/D features 214. While the presence of an air gap generally decreases parasitic capacitance between conductive features due to the dielectric constant of air being lower than that of most dielectric materials, it may introduce inadvertent structural defects in portions of an FET. In one such example, because of its lack of etch-stopping power, the presence of an air gap may cause over-etching (e.g., opening of an already-sealed air gap) of the ILD layer 222 when forming a via contact over the S/D contact 238. Furthermore, any subsequent wet etching process (e.g., for removing a lithographic masking element) may cause wet chemical to flow into the air gap and potentially damage the S/D features 214, the HKMG structure 210, and/or other device features. The present embodiments provide a partial air gap that retains its effectiveness in reducing parasitic capacitance while protecting the device's structure from inadvertent damages during subsequent processing steps. Whether method 100 proceeds in Path A or Path B (discussed in detail below), the present embodiments are directed to methods of first forming the air gap 240 that extends from the S/D features 214 to the top surface of the ILD layer 222 and subsequently filling the upper portion 240a of the air gap 240 disposed in the ILD layer 222, leaving behind the lower portion 240b disposed between the S/D contact 238 and the HKMG structure 210.

Referring to FIG. 8B, method 100 at operation 114a deposits an ESL 250 over the ILD layer 222. The ESL 250 includes one or more dielectric material such as silicon nitride, silicon oxynitride, silicon nitride with oxygen and/or carbon elements, aluminum oxide, aluminum nitride, other suitable materials, or combinations thereof. Notably, in order to provide etching selectivity with respect to the ILD layer 222, the composition of the ESL 250 is distinctly different from that of the ILD layer 222. In some embodiments, the composition of the ESL 250 is similar to that of the ESL 220. The ESL 250 may be formed to any suitable thickness T by any suitable method such as CVD, PVD, ALD, other suitable methods, or combinations thereof. In an example embodiment, the thickness T is about 5 nm to about 15 nm. Of course, the present disclosure is not limited to such dimensions.

Because the upper portion 240a has been filled at the previous operation, a bottom surface of the ESL 250 is disposed over a top surface of the ILD layer 222 and the S/D contact 238. In some embodiments, the entirety of the ESL 250 is above the top surface of the ILD layer 222 and no portion of the ESL 250 penetrates the ILD layer 222. In some examples, the ESL 250 minimally penetrates the ILD layer 222 to a depth of less than about 3 nm.

Figure 9A:
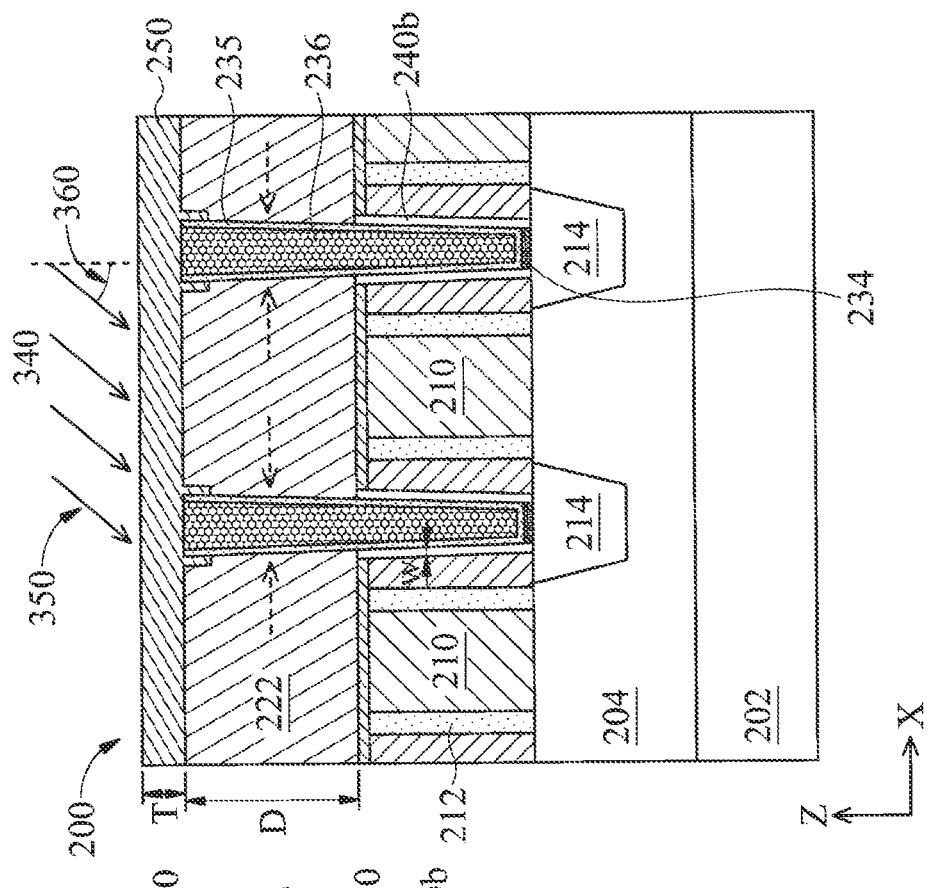

With respect to Path B, referring to FIG. 9A, method 100 proceeds from operation 110 to operation 112b and forms the ESL 250 over the ILD layer 222, thereby sealing the air gap 240 (i.e., the upper portion 240a). As discussed above with respect to operation 114a, the ESL 250 has a composition different from that of the ILD layer 222 and may include one or more dielectric material such as silicon nitride, silicon oxynitride, silicon nitride with oxygen and/or carbon elements, aluminum oxide, aluminum nitride, other suitable materials, or combinations thereof. The ESL 250 may be formed to any suitable thickness T by any suitable method such as CVD, PVD, ALD, other suitable methods, or combinations thereof as discussed above. While the present disclosure does not limit the composition or the thickness T of the ESL 250 as discussed above with respect to operation 114a, some embodiments of the ESL 250 may alter the energy of beam 350 implemented at the subsequent implantation process 340 when compared to the energy of the beam 320 (comparing FIG. 8A with FIG. 9B) as will be discussed in detail below. In contrast to FIG. 8B, due to the presence of the upper portion 240a of the air gap 240 in the ILD layer 222, the ESL 250 forms a portion 250a in the air gap 240. In other words, forming the ESL 250 over the ILD layer 222 partially fills the upper portion 240a. In some examples, the portion 250a has a thickness d of about 3 nm to about 8 nm. The thickness d may vary with the width w of the air gap 240. For example, a ratio of the thickness d to the width w may be about 0.8 to about 3, and a ratio of the thickness d to the thickness D may be about 0.1 to about 0.4. Of course, the present disclosure is not limited to such dimensions.

Figure 9B:
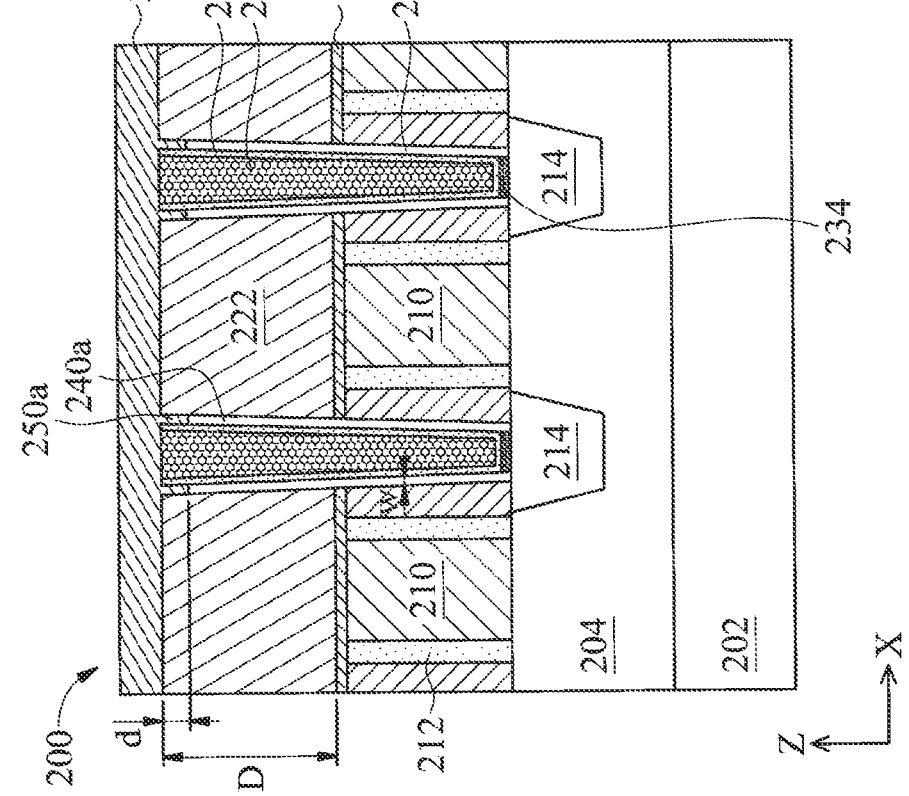

Referring to FIG. 9B, method 100 at operation 114b implements an implantation process 340 to the device 200. Similar to the implantation process 310, the implantation process 340 is configured to fill the upper portion 240a by bombarding the ILD layer 222 with a beam 350 of energetic dopant particles. However, because the ESL 250 is formed over the ILD layer 222 before performing the implantation process 340, the implantation process 340 is configured to first penetrate through the ESL 250 before penetrating the ILD layer 222 and causing the ILD layer 222 to expand.

In the present embodiments, the implantation process 340 is implemented in a manner similar to the implantation process 310 as discussed above. For example, the implantation process 340 may be generally implemented in an ion implantation apparatus that produces, filters, and accelerates the beam 350 of charged ions (i.e., dopant particles) toward the device 200. Furthermore, the implantation process 340 may be tuned by adjusting factors such as composition of the dopant particles, dosage of the dopant particles, energy of the beam 350, and/or angle 360 of the beam 350, similar to the discussion above with respect to the implantation process 310. However, different from the implantation process 310, the implantation process 340 is configured to introduce, via ion bombardment, the dopant particles into the ILD layer 222 through the ESL 250. In other words, the beam 350 as depicted in FIG. 9B is configured to penetrate both the ESL 250 and the ILD 222 in order to fill the upper portion 240a. Thus, in the present embodiments, while a major portion of the dopant particles may be found in the ILD layer 222, a comparatively smaller portion of the dopant particles may also be found in the ESL 250 as will be discussed in detail below.

In the present embodiments, the presence of additional material layer(s) would generally increase the energy of the beam 350 for penetrating the ILD layer 222, while the dosage of the dopant particles may remain substantially unchanged. Thus, in the present embodiments, the energy of the beam 350 is greater than the energy of the beam 320 when other factors such as the dosage of the dopant particles and the angle 360 of the beam 350 remain substantially unchanged. In the present embodiments, the thickness T is about 5 nm to about 15 nm as discussed above, and the energy of the beam 350 may vary proportionally to the thickness T. In an example embodiment, if the thickness T is about 10 nm, the energy of the beam 350 is about 4 to 5 times higher than the energy of the beam 320. In addition, if the ESL 250 includes particles larger than silicon (the major constituent of the ILD layer 222), the energy of the beam 350 may also increase. Because the ESL 250 is formed as a protective layer for the underlying features before performing the implantation process 340, the angle 360 may be implemented at any suitable angle as discussed in detail above without causing damage to the underlying S/D features 214.

Figure 10:
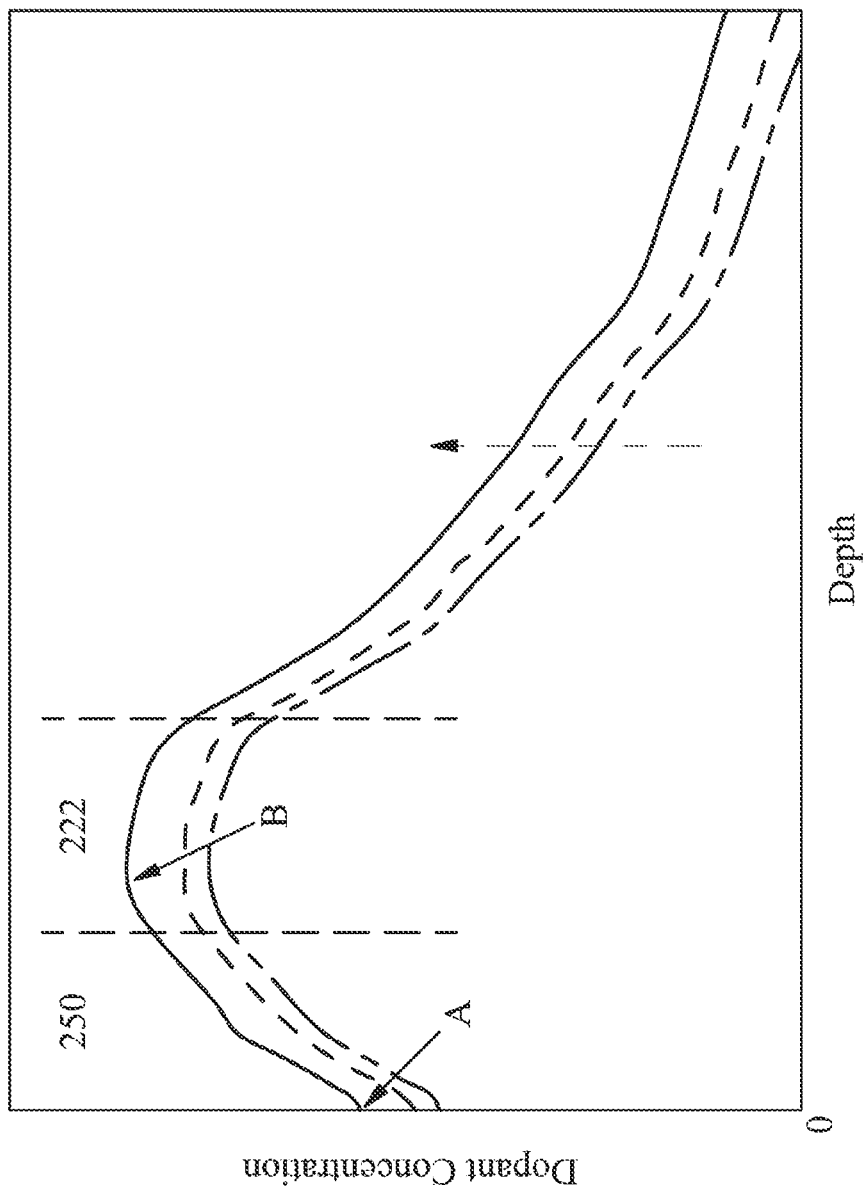
FIG. 10 is a schematic illustration of concentration of dopant particles at varying depths of an example device fabricated according to various embodiments of the present disclosure.

Now referring to FIG. 10, which is a schematic representation of the concentration of the dopant particles as a function of depth below the top surface of the device 200. For purposes of clarity, the region labeled "250" corresponds to the ESL 250 and the region labeled "222" corresponds to the ILD layer 222. In the present embodiments, by tuning the various parameters discussed herein, the implantation process 340 is configured to provide the highest amount of the dopant particles in the ILD layer 222 relative to other material layers in order to expand the ILD layer 222 and fill the upper portion 240a. As depicted in FIG. 10, for example, the concentration of the dopant particles plotted on a logarithm scale on the y-axis increases from A at a depth of 0 (at surface) to its maximum B in the ILD layer 222. In the present embodiments, such increase may be generally about one to two orders of magnitude. In some examples, a ratio of the concentration of the dopant particles in the ILD layer 222 to that in the ESL 250 may be about 5 to about 500. Of course, the present disclosure is not limited to such a range and may adjust the concentration of the dopant particles by means provided herein. Also indicated in FIG. 10 are three curves representing varying dosages and/or beam energy of the dopant particles, where an upward shift of the curves marked by the dotted arrow indicates an increase in dosage at a given depth.

Subsequently, method 100 at operation 116 performs additional processing steps to the device 200. In some examples, method 100 may form additional contact features such as gate contacts over the HKMG 210. Alternatively or additionally, method 100 may form interconnect structures such as vias and/or conductive lines over the device 200.

Although not intended to be limiting, one or more embodiments of the present disclosure provide many benefits to a semiconductor device and the formation thereof. For example, the present disclosure provides a semiconductor structure having an air gap disposed on sidewalls of a bottom portion of an S/D contact but not on sidewalls of a top portion of the S/D contact, such that the air gap is sealed at its top opening by an ILD layer disposed over a metal gate stack adjacent to the S/D contact. In some embodiments, a method of forming such a semiconductor structure includes forming the S/D contact embedded in a first ILD layer and a second ILD layer disposed over the first ILD layer, forming an air gap on the sidewalls of the S/D contact that extends through the first and the second ILD layers, and subsequently filling a portion of the air gap disposed in the second ILD layer. In some embodiments, filling the portion of the air gap includes bombarding the second ILD layer with dopant particles including Ge and/or As, such that the dopant particles cause the second ILD layer to expand and therefore seal the portion of the air gap disposed therein. In the present disclosure, the partial air gap remaining on the sidewalls of the bottom portion of the S/D contact may lower the parasitic capacitance between the S/D contact and the adjacent metal gate stack. Meanwhile, the sealing of the air gap by the ion implantation process may prevent the air gap from being re-opened during subsequent processes and causing structural damage to the device as a result.

In one aspect, the present disclosure provides a semiconductor structure that includes an S/D feature disposed in a semiconductor layer, a metal gate stack (MG) disposed in a first ILD layer and adjacent to the S/D feature, a second ILD layer disposed over the MG, and an S/D contact disposed over the S/D feature. The semiconductor structure further includes an air gap disposed between a sidewall of a bottom portion of the S/D contact and the first ILD layer, where a sidewall of a top portion of the S/D contact is in direct contact with the second ILD layer.

In another aspect, the present disclosure provides a semiconductor structure that includes metal gate stacks (MGs) disposed in a first ILD layer, an S/D feature disposed between the MGs, a second ILD layer disposed over the MGs, and a contact feature disposed over the S/D feature and extends through the first and the second ILD layers. The semiconductor structure further includes an air gap disposed on sidewalls of the contact feature, where the second ILD layer seals the air gap, and an ESL disposed over the second ILD layer, wherein the ESL is separated from the air gap by portions of the second ILD layer.

In yet another aspect, the present disclosure provides a method for forming a semiconductor structure that includes first providing an MG disposed in a first ILD layer, an S/D feature disposed adjacent to the MG, and a second ILD layer disposed over the MG, forming a contact trench in the first and the second ILD layers to expose the S/D feature, forming a sacrificial layer in the contact trench, and forming an S/D contact over the sacrificial layer. The method further includes subsequently removing the sacrificial layer to form an air gap on sidewalls of the S/D contact and filling a top portion of the air gap disposed above the MG, such that a bottom portion of the air gap is sealed by the second ILD layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a metal gate stack (MG) disposed in a first interlayer dielectric (ILD) layer, a source/drain (S/D) feature disposed adjacent to the MG, and a second ILD layer disposed over the MG;
   forming a contact trench in the first and the second ILD layers to expose the S/D feature;
   forming a sacrificial layer in the contact trench;
   forming an S/D contact over the sacrificial layer;
   removing the sacrificial layer to form an air gap on sidewalls of the S/D contact; and
   filling a top portion of the air gap disposed above the MG, such that a bottom portion of the air gap is sealed by the second ILD layer.

2. The method of claim 1, wherein removing the top portion of the air gap includes performing an ion implantation process to the second ILD layer, thereby expanding the second ILD layer to seal the air gap.

3. The method of claim 2, wherein performing the ion implantation process includes bombarding the second ILD layer with particles that include germanium, arsenic, or a combination thereof.

4. The method of claim 1, further comprising, after removing the top portion of the air gap, forming an etch-stop layer (ESL) over the second ILD layer.

5. The method of claim 1, wherein removing the top portion of the air gap includes:
   forming an etch-stop layer (ESL) over the second ILD layer, such that the ESL partially fills the air gap; and
   thereafter, bombarding the second ILD layer with particles that include germanium, arsenic, or a combination thereof.

6. The method of claim 5, wherein bombarding the second ILD layer leaves a portion of the particles in the ESL.

7. The method of claim 1, wherein the sacrificial layer includes amorphous silicon and the second ILD layer includes silicon oxide.

8. A method, comprising:
   forming a source/drain (S/D) feature over a semiconductor substrate;
   forming a first interlayer dielectric (ILD) layer over the S/D feature;
   forming a second ILD layer over the first ILD layer;
   forming an opening in the second ILD layer to expose the S/D feature;
   depositing a sacrificial layer along sidewalls of the opening;
   forming an S/D contact feature over the sacrificial layer;

removing the sacrificial layer to form an air gap wherein the air gap extends from the second ILD layer to expose the S/D feature; and treating the second ILD layer to seal a top portion of the air gap disposed in the second ILD layer without sealing a bottom portion of the air gap disposed in the first ILD layer.

9. The method of claim 8, wherein treating the second ILD layer includes bombarding the second ILD layer with particles that results in the second ILD layer to merge with a sidewall of the S/D contact feature, thereby sealing the top portion of the air gap.

10. The method of claim 9, wherein the particles include germanium, arsenic, or a combination thereof.

11. The method of claim 9, wherein bombarding the second ILD layer is implemented at an angle relative to a direction normal to a top surface of the second ILD layer.

12. The method of claim 8, further comprising forming an etch-stop layer (ESL) over the second ILD layer after treating the second ILD layer.

13. The method of claim 8, further comprising forming an etch-stop layer (ESL) over the second ILD layer before treating the second ILD layer, such that a portion of the ESL partially fills the air gap.

14. A method, comprising:
providing a semiconductor structure that includes a source/drain (S/D) feature disposed adjacent to a gate structure, wherein the gate structure is disposed in a first interlayer dielectric (ILD) layer;

forming a second ILD layer over the gate structure;

removing portions of the first and the second ILD layers to expose the S/D feature in a first opening;

forming a sacrificial layer in the first opening;

forming a conductive feature over the sacrificial layer to fill the first opening;

etching the sacrificial layer to form a second opening, wherein the second opening includes a top portion separating the conductive feature from the second ILD layer and a bottom portion separating the conductive feature from the first ILD layer; and merging the second ILD layer with a sidewall of the conductive feature, thereby sealing the top portion of the second opening with respect to the bottom portion.

15. The method of claim 14, wherein the sacrificial layer includes amorphous silicon.

16. The method of claim 14, wherein the merging of the second ILD layer includes implanting particles to the second ILD layer, thereby causing the second ILD layer to expand toward the sidewall of the conductive feature.

17. The method of claim 16, wherein the particles include germanium, arsenic, or a combination thereof.

18. The method of claim 14, further comprising forming an etch-stop layer (ESL) over the second ILD layer, such that a portion of the ESL extends into the second opening.

19. The method of claim 14, further comprising forming an etch-stop layer (ESL) over the merged second ILD layer.

20. The method of claim 14, wherein the sacrificial layer includes amorphous silicon and the second ILD layer includes silicon oxide.

* * * * *